(12) United States Patent
Yaegashi et al.

(10) Patent No.: US 11,673,313 B2
(45) Date of Patent: Jun. 13, 2023

(54) IMPRINT APPARATUS AND ARTICLE MANUFACTURING METHOD

(71) Applicant: CANON KABUSHIKI KAISHA, Tokyo (JP)

(72) Inventors: Kenji Yaegashi, Utsunomiya (JP); Takamitsu Komaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 48 days.

(21) Appl. No.: 16/880,160

(22) Filed: May 21, 2020

(65) Prior Publication Data

US 2020/0376739 A1  Dec. 3, 2020

(30) Foreign Application Priority Data

May 28, 2019 (JP) .............................. JP2019-099733

(51) Int. Cl.
| | |
|---|---|
| *G03F 7/20* | (2006.01) |
| *B29C 59/02* | (2006.01) |
| *B29C 35/08* | (2006.01) |
| *B29C 33/12* | (2006.01) |
| *B29C 33/42* | (2006.01) |
| *G03F 9/00* | (2006.01) |
| *G03F 7/00* | (2006.01) |

(52) U.S. Cl.
CPC ............ *B29C 59/02* (2013.01); *B29C 33/126* (2013.01); *B29C 33/424* (2013.01); *B29C 35/0805* (2013.01); *G03F 7/70516* (2013.01); *G03F 9/7019* (2013.01); *G03F 9/7042* (2013.01); *G03F 9/7088* (2013.01)

(58) Field of Classification Search
CPC ..... B29C 59/02; B29C 33/126; B29C 33/424; B29C 35/0805; G03F 7/70516; G03F 9/7019; G03F 9/7042; G03F 9/7088; G03F 7/0002; G03F 7/2012; H01L 21/027

See application file for complete search history.

(56) References Cited

U.S. PATENT DOCUMENTS 10,001,702 B2    6/2018  Toshima
2014/0339721 A1* 11/2014  Toshima ............... G03F 7/0002
                                                        264/40.5

FOREIGN PATENT DOCUMENTS

JP         2014241398 A    12/2014

\* cited by examiner

*Primary Examiner* — Mesfin T Asfaw
(74) *Attorney, Agent, or Firm* — Rossi, Kimms & McDowell LLP

(57) ABSTRACT

An imprint apparatus brings an imprint material on a substrate including a first mark into contact with a mold including a second mark and cures the imprint material, thereby forming a cured product of the imprint material on the substrate. The apparatus includes a plurality of detectors used for alignment detection, and a controller configured to obtain a plurality of pieces of relative position information by detecting a relative position between the first mark and the second mark a plurality of times using the plurality of detectors in a state in which the imprint material is cured and a positional relationship between the substrate and the mold is maintained, and to calibrate, based on the plurality of pieces of relative position information, a plurality of detection processing operations each performed using each of the plurality of detectors.

9 Claims, 6 Drawing Sheets

CURING STEP

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

There is an imprint apparatus that brings an imprint material on a substrate into contact with a mold and cures the imprint material, thereby forming a pattern made of a cured product of the imprint material on the substrate. In the imprint apparatus, as in an exposure apparatus, the overlay accuracy between an underlying pattern formed on a substrate and a pattern newly formed on the underlying pattern by the imprint apparatus is important. Japanese Patent Laid-Open No. 2014-241398 discloses that after a resin (imprint material) on a substrate is brought into contact with a mold and cured, the relative positional shift between a mark on the substrate and a mark on the mold is detected using a detector. In a state in which the resin has been cured, the substrate and the mold are connected by the resin, so that the positional shift between the mark on the substrate and the mark on the mold can be detected in a state in which a relative vibration between the substrate and the mold is reduced.

It has been found that in an imprint apparatus including a plurality of detectors, there is an unacceptable difference among a plurality of results detected using the plurality of detectors. Possible causes of this difference include individual differences among the plurality of detectors, for example, a wavelength difference and light amount difference of light generated by a light source, an error in assembly adjustment of a detection optical system, alignment marks and their peripheral structures, and the like. If such individual differences exist, it is difficult to implement high overlay accuracy.

SUMMARY OF THE INVENTION

The present invention provides a technique advantageous in implementing high overlay accuracy.

One of aspects of the present invention provides an imprint apparatus that brings an imprint material on a substrate including a first mark into contact with a mold including a second mark and cures the imprint material, thereby forming a cured product of the imprint material on the substrate, comprising: a plurality of detectors used for alignment detection; and a controller configured to obtain a plurality of pieces of relative position information by detecting a relative position between the first mark and the second mark a plurality of times using the plurality of detectors in a state in which the imprint material is cured and a positional relationship between the substrate and the mold is maintained, and to calibrate, based on the plurality of pieces of relative position information, a plurality of detection processing operations each performed using each of the plurality of detectors.

Further features of the present invention will become apparent from the following description of exemplary embodiments with reference to the attached drawings.

DESCRIPTION OF THE EMBODIMENTS

Figure 1:
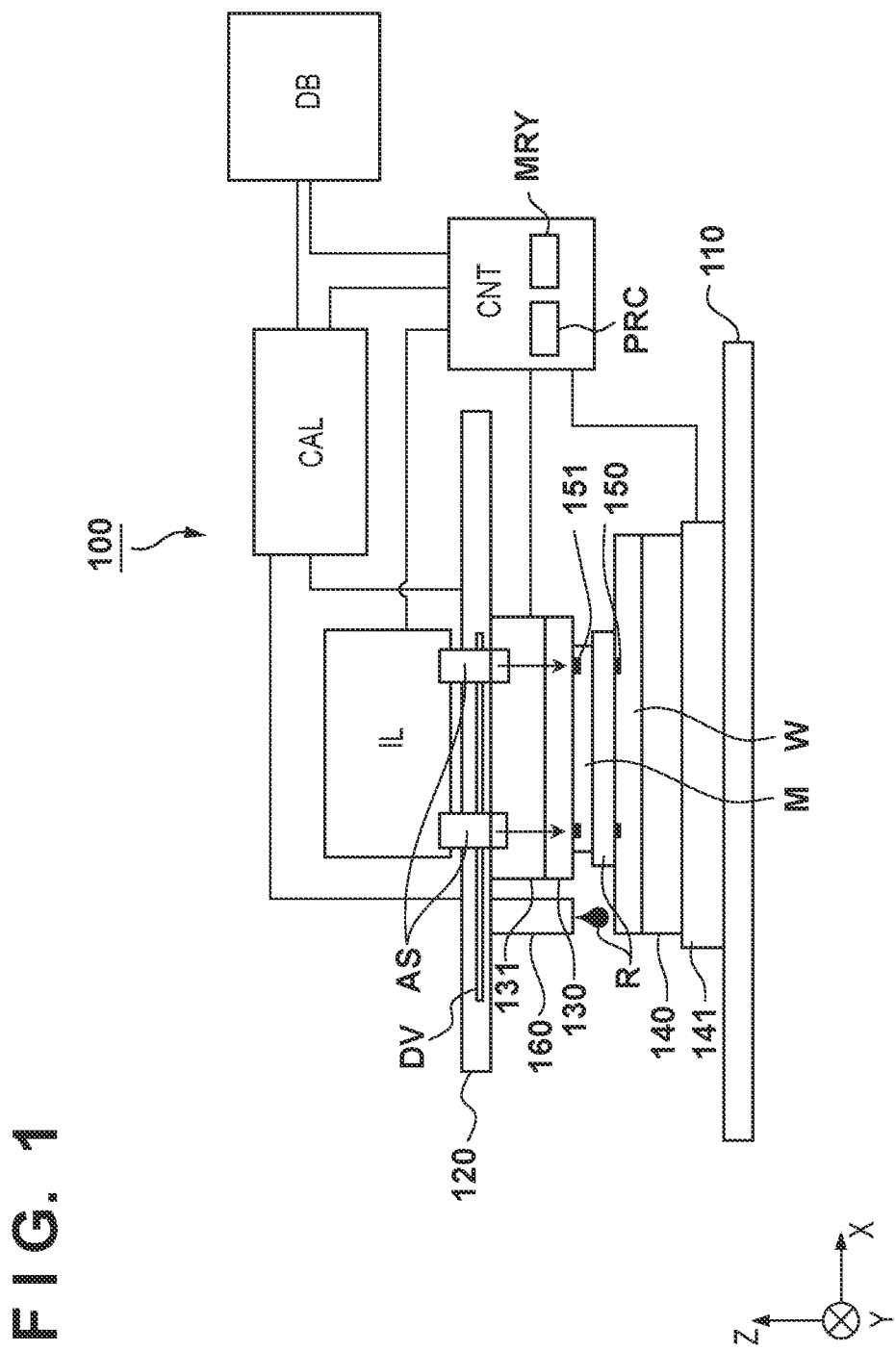
FIG. 1 is a view showing the arrangement of an imprint apparatus according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 shows the arrangement of an imprint apparatus 100 according to an embodiment. The imprint apparatus 100 brings an imprint material R on a substrate W into contact with a mold M and cures the imprint material R, thereby forming a pattern made of a cured product of the imprint material R on the substrate W. As the imprint material, a curable composition (to be also referred to a resin in an uncured state) to be cured by receiving curing energy is used. As the curing energy, an electromagnetic wave or heat can be used. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The imprint material may be supplied onto the substrate in the form of a film by a spin coater or a slit coater. The viscosity (the viscosity at 25° C.) of the imprint material can be, for example, 1 mPa·s (inclusive) to 100 mPa·s (inclusive).

As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass. An example will be described below in which the imprint material R is cured by irradiating the imprint material R on the substrate W with light such as ultraviolet light as curing energy, but the curing energy may be another energy.

The imprint apparatus 100 performs an imprint operation to form a pattern made of a cured product of the imprint material R on a shot region of the substrate W. By repeating the imprint operation, the pattern can be formed on each of a plurality of shot regions of the substrate W. One imprint operation can include a step of bringing the imprint material R on the substrate W into contact with the mold M, a step of curing the imprint material R, and a step of separating the cured imprint material R (that is, a cured product of the imprint material R) from the mold M. One imprint operation may include a step of arranging the imprint material R on a shot region.

In the specification and the accompanying drawings, directions will be indicated on an XYZ coordinate system in which directions parallel to the surface of the substrate W are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning means controlling the position and/or orientation. Alignment (positioning) can include controlling the position and/or orientation of at least one of the substrate W and the mold M such that the alignment error (overlay error) between the shot region of the substrate W and the pattern region of the mold M decreases. In addition, alignment can include control to correct or change the shape of at least one of the shot region of the substrate W and the pattern region of the mold M.

The imprint apparatus 100 can include a curing device IL, a plurality of detectors AS, a driver DV, a support structure 120, a mold holder 130, a mold driver 131, a substrate holder 140, a substrate driver 141, a base structure 110, a calculator CAL, a controller CNT, a storage device DB, and the like. After the imprint material R on the substrate W is brought into contact with the mold M and a gap between the substrate W and the mold M is sufficiently filled with the imprint material R, the curing device IL irradiates the imprint material R with light as curing energy to cure the imprint material R. The curing device IL can be configured to irradiate the imprint material R with light through the mold M. The mold M can be made of a light transmissive material such as quartz which transmits light from the curing device IL.

Each of the plurality of detectors AS includes an alignment scope, and is used to detect the relative position between a mark (first mark) 150 provided on the substrate W and a mark (second mark) 151 provided on the mold M, that is, used for alignment detection. The driver DV drives the plurality of detectors AS. The support structure 120 supports the mold driver 131 and the driver DV.

The mold holder 130 holds the mold M, and the mold driver 131 can drive the mold holder 130 such that the mold M is driven in a plurality of axes (for example, three axes of the Z-axis, the θX-axis, and the θY-axis, and preferably six axes of the X-axis, the Y-axis, the Z-axis, the θX-axis, the θY-axis, and the θZ-axis). The substrate holder 140 holds the substrate W, and the substrate driver 141 can drive the substrate holder 140 such that the substrate W is driven in a plurality of axes (for example, three axes of the X-axis, the Y-axis, and the θZ-axis, and preferably six axes of the X-axis, the Y-axis, the Z-axis, the θX-axis, the θY-axis, and the θZ-axis). The mold driver 131 and the substrate driver 141 form a driving mechanism that drives at least one of the substrate W and the mold M so as to adjust the relative position between the substrate W and the mold M. Adjustment of the relative position by the driving mechanism includes driving for bringing the mold M into contact with the imprint material R on the substrate W and separating the mold M from the cured imprint material (a pattern of a cured product). The base structure 110 supports the substrate driver 141.

The imprint apparatus 100 may include a dispenser (supplier) 160 that supplies or arranges the imprint material R on the substrate W. The imprint material R may be arranged on the substrate W by an external apparatus of the imprint apparatus 100. The controller CNT controls the curing device IL, the plurality of detectors AS, the driver DV, the mold holder 130, the mold driver 131, the substrate holder 140, the substrate driver 141, and the like, and can perform the imprint operation with respect to each of the plurality of shot regions of the substrate. The controller CNT can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components.

The calculator CAL can process information detected or obtained by each of the plurality of detectors AS to detect the relative position between the shot region of the substrate W and the pattern region of the mold M or the relative position between the first mark of the substrate W and the second mark of the mold M. The calculator CAL may be incorporated in each detector AS, or may be incorporated in the controller CNT. In one example, each detector AS can include an imaging sensor and a microscope (alignment scope) that forms an optical image (for example, a projection image, an interference fringe, or a moire fringe) formed by the first mark 150 and the second mark 151 on the imaging sensor. The optical image formed by the first mark of the substrate W and the second mark of the mold M is captured by the imaging sensor, and the captured image can be provided to the calculator CAL. The calculator CAL can process the image provided from the detector AS to detect the relative position between the first mark and the second mark of the mold M. The storage device DB can store information output from the detector AS and information output from the calculator CAL. The processing as described above is executed for a plurality of mark pairs (each mark pair is formed by the first mark 150 and the second mark 151).

The first mark 150 provided on the substrate W and the second mark 151 provided on the mold M can be used for alignment between the shot region of the substrate W and the mold M. The first mark 150 of the substrate W and the second mark 151 of the mold M can be arranged so as to overlap each other in a state in which both are aligned with a predetermined accuracy. The controller CNT obtains the alignment error between the shot region of the substrate W and the mold M based on the relative position information provided for the plurality of mark pairs. The alignment error can include, for example, an X-direction positional shift, a Y-direction positional shift, a rotation about the Z-axis, a magnification, and the like. Based on the obtained alignment error, the controller CNT determines a command value to the substrate driver 141 and/or the mold driver 131 such that the alignment error falls within an allowable range, and transmits the command value to the substrate driver 141 and/or the mold driver 131. The substrate driver 141 drives the substrate W in accordance with the provided command value, and the mold driver 131 drives the mold M in accordance with the provided command value. With this operation, the shot region of the substrate W is aligned with the mold M. The imprint apparatus 100 may include a deformation mechanism that deforms the mold M and/or a deformation mechanism that deforms the shot region of the substrate W to reduce the alignment error caused by the magnification difference between the shot region of the substrate W and the mold M.

The imprint material R can be supplied or arranged on the shot region of the substrate using the dispenser 160. The controller CNT can control the amount of the imprint material R to be discharged from the dispenser 160 and the discharge timing of the imprint material R from the dispenser 160. The controller CNT may use information provided from the calculator CAL to control processing of arranging the imprint material R on the shot region of the substrate W using the dispenser 160.

The light irradiation time and light irradiation intensity by the curing device IL can be determined in accordance with the type and amount of the imprint material R arranged on the substrate W. The light irradiation time and light irradiation intensity by the curing device IL can be controlled by the controller CNT. The information of the alignment error obtained using the detectors AS may be used to control the curing device IL upon curing the imprint material R on the shot region of the substrate W. The longer the light irradiation time for curing the imprint material arranged on the substrate W, the larger the alignment error between the shot region of the substrate W and the mold M after the imprint material R is cured may be. Therefore, the controller CNT may use the alignment error after curing to determine the irradiation time and irradiation intensity in a subsequent imprint operation.

Figure 2:
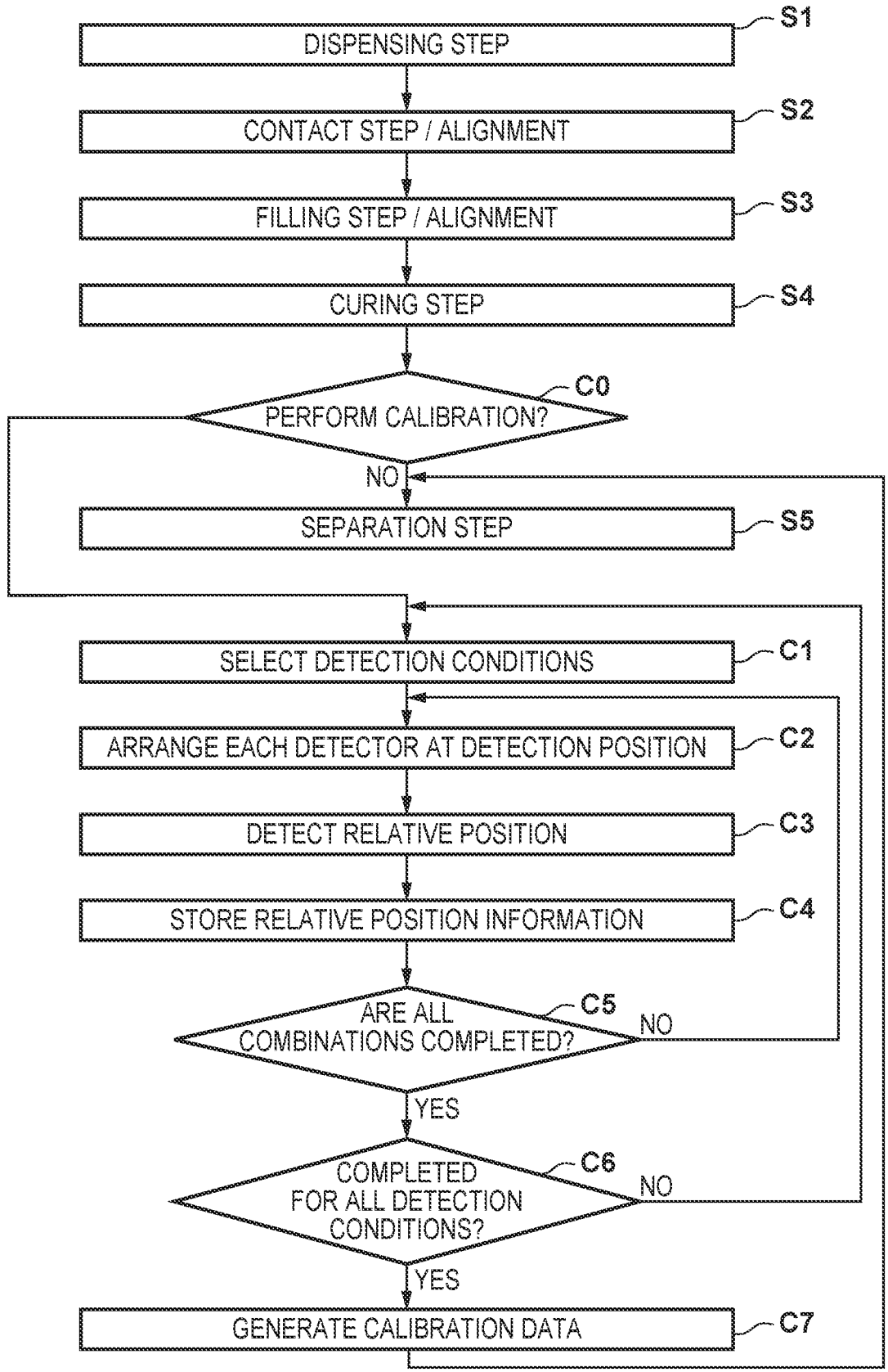
FIG. 2 is a flowchart exemplarily illustrating an imprint operation and a calibration operation.

FIG. 2 illustrates one imprint operation (the imprint operation for one shot region) and a calibration operation performed by the imprint apparatus 100. These operations are controlled by the controller CNT. In one example, the controller CNT includes a memory MRY storing a program and a processor PRC that executes the program, and the processor PRC can perform the imprint operation and the calibration operation.

First, the imprint operation will be described. When a pattern is formed in each of the plurality of shot regions of the substrate W, the imprint operation illustrated in FIG. 2 is performed for each shot region. In step S1 (dispensing step), the imprint material is arranged or supplied on the shot region of the substrate W using the dispenser 160. Arrangement information of the imprint material R for arranging the imprint material R on the shot region of the substrate W is stored in the memory MRY of the controller CNT. The controller CNT can control the arrangement of the imprint material R on the shot region based on the arrangement information. The arrangement information can be determined considering information of the pattern of the mold M and a residual layer thickness (RLT). For example, when increasing the RLT, the distance between droplets of the imprint material R is reduced, so that the droplets can be arranged with a high density. The residual layer thickness is the distance (thickness) between the surface (bottom surface) of the concave portion of a concave-convex pattern formed by the cured imprint material R and the surface of the substrate during imprinting.

Next, in step S2 (contact step), the mold driver 131 and/or the substrate driver 141 is driven so as to bring the imprint material R on the shot region of the substrate W into contact with the mold M. For example, after the imprint material R is supplied onto the shot region of the substrate W, the substrate W is driven by the substrate driver 141 such that the shot region of the substrate W faces the mold M. After the shot region of the substrate W faces the mold M, the mold driver 131 lowers the mold M, and the imprint material R on the shot region of the substrate W comes into contact with the mold M. Here, alignment between the shot region of the substrate W and the mold M can be started at the stage in which the detector AS can detect the optical image formed by the first mark 150 of the substrate W and the second mark 151 of the mold M. The alignment may be started before the imprint material R on the substrate W and the mold M contact each other, or may be started after they contact each other.

Then, in step S3 (filling step), the space between the shot region of the substrate W and the mold M and the concave portion forming the pattern of the mold M are filled with the imprint material R. The filling step is adjusted such that the unfilling of the concave portion forming the pattern of the mold M with the imprint material R does not occur when the imprint material R is cured. In parallel with the filling step, alignment between the shot region of the substrate W and the mold M is performed.

Then, in step S4 (curing step), the curing device IL irradiates the imprint material R with light as curing energy, and cures the imprint material R. Here, the alignment may be completed before curing of the imprint material R is started. Alternatively, the alignment may be continued while a part of the imprint material R in the shot region is cured, and be completed when the alignment error falls within the allowable range, and then the imprint material R in the entire shot region may be cured.

Subsequently, in step C0, the controller CNT determines whether to perform a calibration operation. If a calibration operation is performed, the process advances to step C1; otherwise, the process advances to step S5. In step S5 (separation step), the cured imprint material R on the shot region of the substrate W is separated from the mold M by, for example, lifting the mold M by the mold driver 131. Note that step S2 (contact step) and step S5 (separation step) may be performed by driving the mold M by the mold driver 131, may be performed by driving the substrate W by the substrate driver 141, or may be performed by driving the both.

Figure 3A:
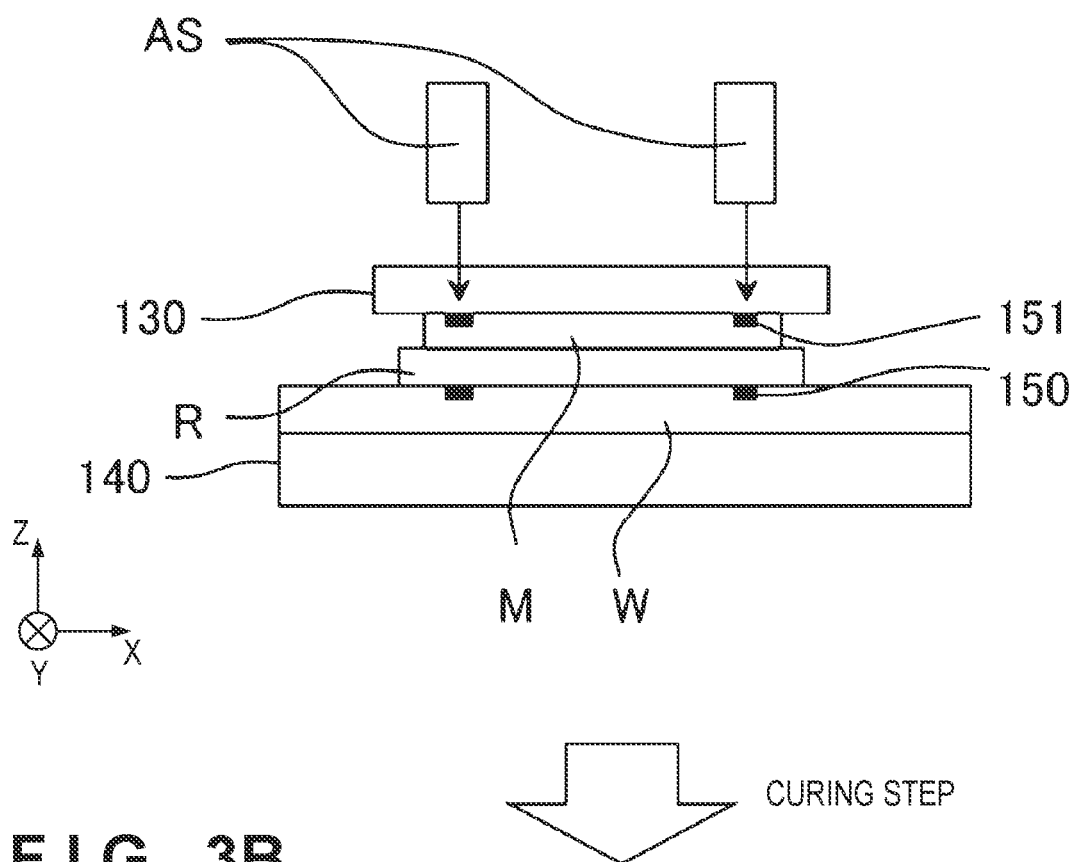
FIGS. 3A and 3B are views exemplarily showing alignment errors.
Figure 3B:
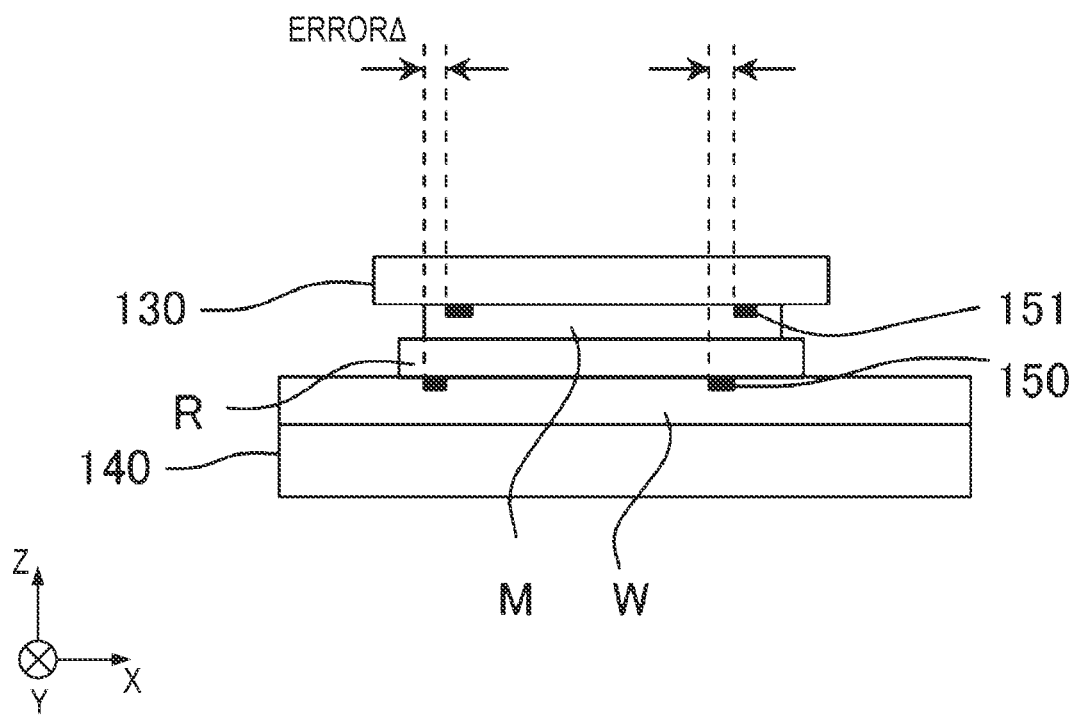
Figure 4:
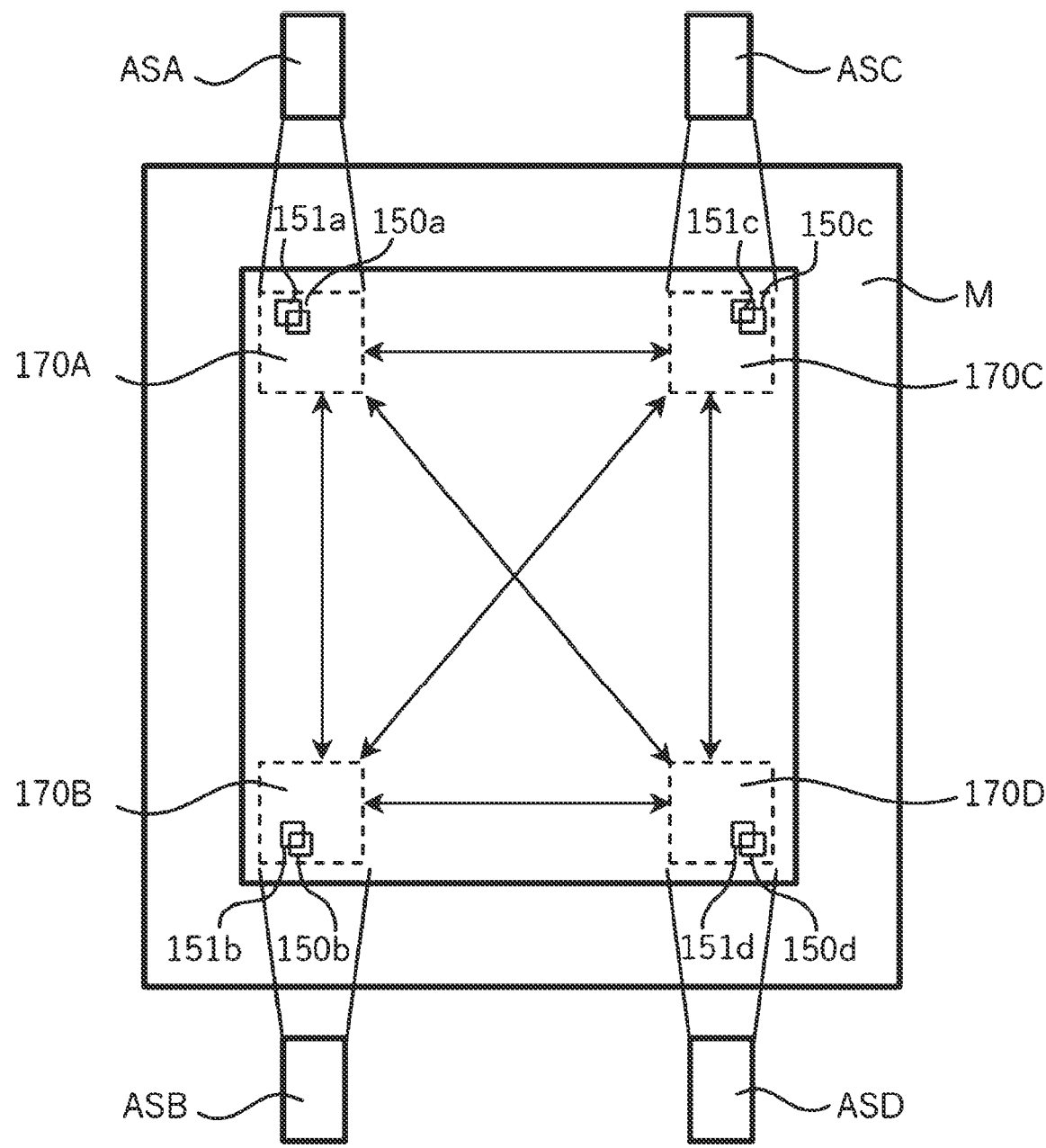
FIG. 4 is a view exemplarily showing detection positions in the calibration operations.

With reference to FIGS. 2 to 4, an alignment operation in the imprint operation will be described below. FIG. 3A shows the alignment operation before the curing step (S4) is started. After the imprint material R is supplied onto the shot region in the dispensing step (S1), the substrate W is driven such that the shot region is arranged below the mold M. In one example, alignment is started before the contact step (S2) is started. For each of the plurality of mark pairs, the relative position between the first mark 150 of the substrate W and the second mark 151 of the mold M is detected using the detector AS, and the alignment operation between the shot region of the substrate W and the mold M is performed based on the detection results. In parallel with the alignment operation, the contact step (S2) and the filling step (S3) are performed. After that, the curing step (S4) is performed. As has been described above, the alignment may be completed before curing of the imprint material R is started. Alternatively, the alignment may be continued while a part of the imprint material R in the shot region is cured, and be completed when the alignment error falls within the allowable range, and then the imprint material R in the entire shot region may be cured. The relative position between the first mark 150 and the second mark 151 or the alignment error can be detected by the detector AS until the separation step (S5) is started.

FIG. 3B shows a mark detection operation in the calibration operation (C1 to C7) that can be performed in a state in which the imprint material R is cured in the curing step (S4) and the positional relationship between the substrate W and the mold M is maintained. The calibration operation can be performed, for example, in a period after the curing step (S4) and before the separation step (S5). Even in the separation step (S5), if the positional relationship between the substrate W and the mold M is maintained, the calibration operation (C1 to C7) can be performed. When the curing step (S4) of the imprint material R is completed, the relative position between the shot region of the substrate W and the pattern formed on (transferred to) the imprint material R is determined. That is, the relative position between the shot region and the mold M when the curing step (S4) of the imprint material R is completed can have a high correlation with the relative position obtained using an overlay inspection device outside the imprint apparatus 100 after the separation step (S5) is completed.

FIG. 3B shows a state in which the detection operation is performed on a mark pair formed by one of the first marks 150 of the substrate W and the corresponding second mark 151 of the mold M, and the relative position between the first mark 150 and the second mark 151 is detected as an alignment error A. This mark pair can be the same as the mark pair whose relative position is detected using at least one of the plurality of detectors AS in alignment performed in parallel with the contact step (S2) and the filling step (S3). That is, after detecting the relative position between the first mark 150 and the second mark 151 forming a mark pair using at least one of the plurality of detectors AS, performing alignment between the substrate and the mold, and curing the imprint material, the calibration operation can be performed using the mark pair. Alternatively, a mark pair used in the calibration operation may be different from a mark pair whose relative position is detected using at least one of the plurality of detectors AS in alignment performed in parallel with the contact step (S2) and the filling step (S3).

In the calibration operation, for the same mark pair, the relative position between the first mark 150 and the second mark 151 is detected using each of the plurality of detectors AS to be calibrated. If no individual difference exists among the plurality of detectors AS, the relative positions obtained using the plurality of detectors AS should coincide with each other. However, there can be non-negligible differences among the plurality of detectors AS. For the same mark pair, by detecting the relative position between the first mark 150 and the second mark 151 using the plurality of detectors AS to be calibrated, it is possible to calibrate, based on the detected relative positions, a plurality of detection processing operations each performed using each of the plurality of detectors AS. In this embodiment, the controller CNT obtains a plurality of pieces of relative position information by detecting the relative position between the first mark 150 and the second mark 151 a plurality of times using the plurality of detectors AS in a state in which the imprint material is cured and the positional relationship between the substrate W and the mold M is maintained. Then, based on the plurality of pieces of relative position information, the controller CNT calibrates the plurality of detection processing operations each performed by each of the plurality of detectors AS.

With reference FIG. 2 again, the details of the calibration operation will be exemplarily described. As has been described above, in step C0, the controller CNT determines whether to perform a calibration operation. If a calibration operation is performed, the process advances to step C1; otherwise, the process advances to step S5. This determination is performed in accordance with a preset condition. For example, after the process is changed, after the setting of the curing device IL is changed, after the imprint apparatus 100 is reset, or after the substrate or mold is replaced, a calibration operation can be performed in an imprint operation for the first one or plurality of shot regions.

In step C1, the settings of the detector AS such as the intensity of illumination light, the wavelength of illumination light, the lightning frequency, and the noise reduction function are set. For example, when the light source is a broadband light source, the wavelength of illumination light can be selected using a wavelength selector such as a wavelength filter. When the light source is a narrowband light source such as a laser diode (LD), a plurality of LDs can be used. In this case, a combination of LDs to be turned on can be adjusted. If the light source can use a DC power source and an AC power source in combination, it is possible to change the output characteristics of the light source by setting the light amount by the supply amount from the DC power source and adjusting the amplitude and frequency of the AC power source. With respect to the noise reduction function, when using the light source such as an LD having strong coherence, the detection performance may be impaired by noise entering the image sensor. As a measure against this, a method of diffusing light by arranging ground glass in the optical path, a method of arranging a movable mirror and moving the position of light by mirror reflection during the accumulation time of the image sensor to reduce the influence of noise, or the like can be used.

Then, in step C2, the driver DV arranges each detector AS to be calibrated at the detection position of the mark pair to be detected. This detection position is changed each time step C2 is executed after step C5 is executed. With reference to FIG. 4, the detection position in the calibration operation will be described. Here, there are four detectors AS to be calibrated, and they are described as a first detector ASA, a second detector ASB, a third detector ASC, and a fourth detector ASD. In addition, the mark pair to be detected can be at least one mark pair, but an example will be described here in which a first mark pair, a second mark pair, a third mark pair, and a fourth mark pair are used as the mark pairs to be detected. The first mark pair is formed by a first mark 150a of the substrate and a second mark 151a of the mold. The second mark pair is formed by a first mark 150b of the substrate and a second mark 151b of the mold. The third mark pair is formed by a first mark 150c of the substrate and a second mark 151c of the mold. The fourth mark pair is formed by a first mark 150d of the substrate and a second mark 151d of the mold.

In step C2 executed for the first time after step C1, as shown in FIG. 4, the driver DV can arrange the first to fourth detectors ASA to ASD such that the first to fourth mark pairs enter detection fields 170a to 170d of the first to fourth detectors ASA to ASD, respectively. In step C2 executed for the second time after step C1, the driver DV can arrange the first to fourth detectors ASA to ASD such that the second, third, fourth, and first mark pairs enter the detection fields 170a to 170d of the first to fourth detectors ASA to ASD, respectively. In step C2 executed for the third time after step C1, the driver DV can arrange the first to fourth detectors ASA to ASD such that the third, fourth, first, and second mark pairs enter the detection fields 170a to 170d of the first to fourth detectors ASA to ASD, respectively. In step C2 executed for the fourth time after step C1, the driver DV can arrange the first to fourth detectors ASA to ASD such that the fourth, first, second, and third mark pairs enter the detection fields 170a to 170d of the first to fourth detectors ASA to ASD, respectively.

In step C3, each of the first to fourth detectors ASA to ASD is used to detect the relative position between the first mark and the second mark forming the mark pair in its detection field, and relative position information indicating the relative position detected in step C3 is stored in the storage device DB in step C4. In step C5, the controller CNT determines whether each mark pair to be detected has been detected by all the detectors to be calibrated. If each mark pair to be detected has been detected by all the detectors to be calibrated, the controller CNT advances the process to step C6; otherwise, the process returns to step C2. In step C6, the controller CNT determines whether steps C1 to C5 have been executed for all detection conditions. If steps C1 to C5 have been executed for all detection conditions, the controller CNT advances the process to step C7; otherwise, the controller CNT returns the process to step C1 to change the detection condition and execute steps C2 to C5. Note that steps C2 to C5 may be executed only for one detection condition. In addition, the mold M for calibration with the second mark formed thereon may be used in the calibration operation. In this case, only the second mark 151 needs to be formed on the mold, and a pattern need not be formed thereon.

In step C7, based on the results obtained in steps C1 to C6 (the pieces of relative position information stored in step C4), the controller CNT calibrates a plurality of detection processing operations each performed using each of the plurality of detectors ASA to ASD. For example, the controller CNT can use, as a reference, the detection processing performed using one detector selected from the plurality of detectors ASA to ASD to calibrate the detection processing performed using the other detector of the plurality of detectors ASA to ASD. For example, when the detection results (pieces of relative position information) of the first to fourth mark pairs detected using the detector ASA are good (for example, the variation is small), the controller CNT can calibrate the other detectors ASB, ASC, and ASD while using the detector ASA as a reference. Alternatively, the detector used as the reference may be determined in advance based on the stability, reproducibility, variation, or the like in detection results in the past.

When the other detectors ASB, ASC, and ASD are calibrated while using the detector ASA as the reference, offset values (correction values) to be added to the detection results obtained by the detectors ASB, ASC, and ASD can be determined as follows. Here, $(X_A', Y_A')$ represents a calibrated relative position detected by the detector ASA, and is equal to uncalibrated $(X_A, Y_A)$ detected by the detector ASA. $(X_B', Y_B')$ represents a calibrated relative position detected by the detector ASB, and is obtained by adding an offset value $(O_{XB}, O_{YB})$ determined by the calibration to uncalibrated $(X_B, Y_B)$ detected by the detector ASB. $(X_C', Y_C')$ represents a calibrated relative position detected by the detector ASC, and is obtained by adding an offset value $(O_{XC}, O_{YC})$ determined by the calibration to uncalibrated $(X_C, Y_C)$ detected by the detector ASC. $(X_D', Y_D')$ represents a calibrated relative position detected by the detector ASD, and is obtained by adding an offset value $(O_{XD}, O_{YD})$ determined by the calibration to uncalibrated $(X_D, Y_D)$ detected by the detector ASD.

$$(X_A',Y_A')=(X_A,Y_A)+(0,0)$$

$$(X_B',Y_B')=(X_B,Y_B)+(O_{XB},O_{YB})$$

$$(X_C',Y_C')=(X_C,Y_C)+(O_{XC},O_{YC})$$

$$(X_D',Y_D')=(X_D,Y_D)+(O_{XD},O_{YD})$$

In the example described above, the mark pair that enters the detection field of the detector AS is selected by moving the detector AS. That is, in the example described above, the controller CNT executes processing of moving the detector selected from the plurality of detectors to the detection position of the mark pair formed by the first mark and the second mark and obtaining the relative position between the first mark and the second mark while changing the selected detector. With this operation, the plurality of pieces of relative position information are obtained, and the detection processing using each detector is calibrated. Alternatively, the mark pair that enters the detection field of the detector AS may be selected by moving the substrate by the substrate driver 141. That is, the controller CNT can execute processing of moving the substrate such that the mark pair formed by the first mark and the second mark enters the field of view of the detector selected from the plurality of detectors and obtaining the relative position between the first mark and the second mark while changing the selected detector. With this operation, the plurality of pieces of relative position information are obtained, and detection processing using each detector can be calibrated.

Figure 5:
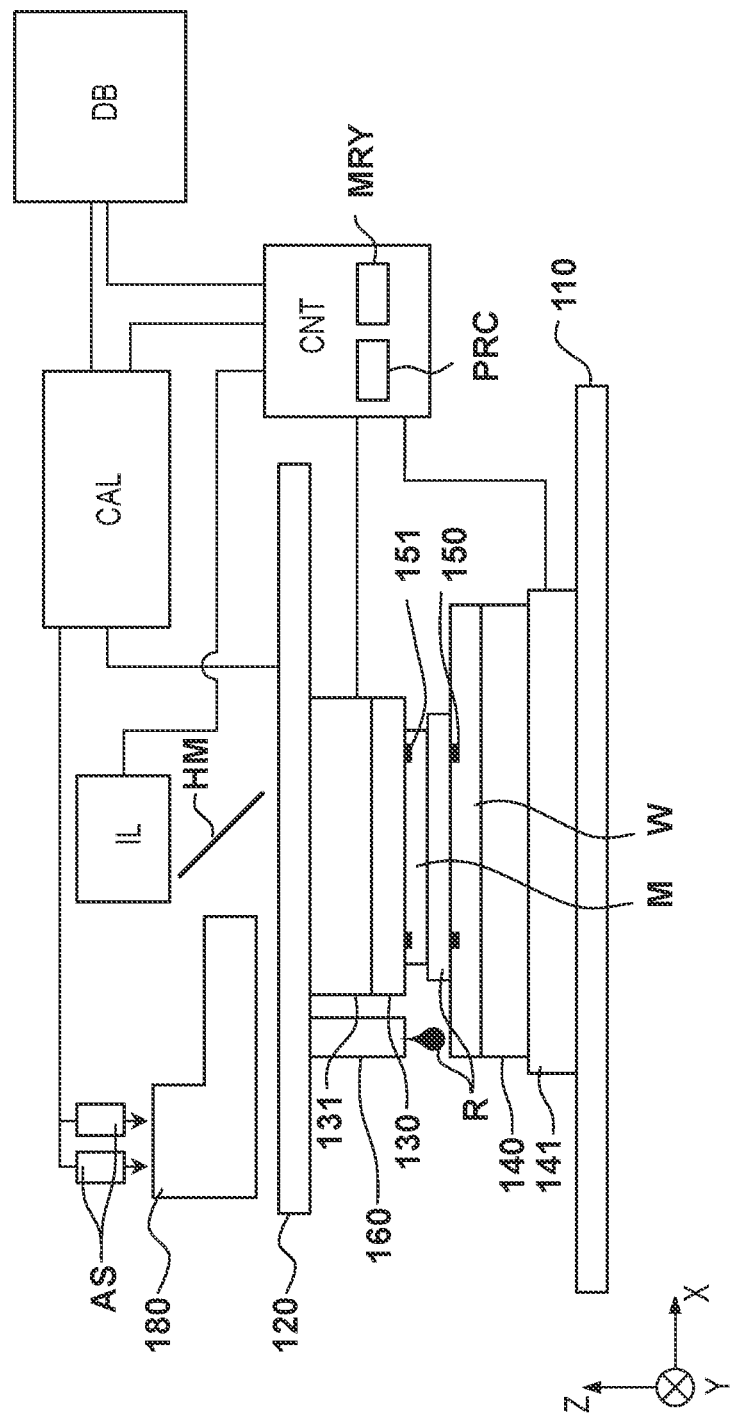
FIG. 5 is a view showing the arrangement of an imprint apparatus according to another embodiment.

FIG. 5 shows the arrangement of an imprint apparatus 200 according to another embodiment. In the imprint apparatus 100 shown in FIG. 1, the detectors AS need to be moved to the detection positions after curing step S4 is executed. Otherwise, light from the curing device IL to the imprint material R can be blocked by the detectors AS. Therefore, in the imprint apparatus 200 shown in FIG. 5, there are provided a half mirror HM and an optical system 180 that branch light of the detectors AS from the optical path between a curing device IL and a mold M. According to this arrangement, regardless of the positions of the detectors AS, the curing step by the curing device IL can be executed. The remaining arrangement and operations of the imprint apparatus 200 can be similar to those of the imprint apparatus 100 shown in FIG. 1.

In the imprint apparatuses 100 and 200, the relative position information between the first mark and the second mark detected in a state in which the imprint material is cured and/or the offset values can be stored in the storage device DB. When an imprint operation is performed under the same or similar conditions as in or to the imprint operation for the substrate or shot region which has undergone the calibration operation, it is possible to refer to the relative position information and/or the offset values stored in the storage device DB. Therefore, execution of the calibration operation can be omitted.

The storage device DB may be connected to a plurality of imprint apparatuses and measurement devices (for example, an overlay measurement device and a layer thickness meter), and information obtained by another imprint apparatus and measurement device may be referred to. In addition, individual differences among the plurality of detectors may be calibrated by storing, in the storage device DB, overlay errors (alignment errors A) generated in imprint operations for the plurality of shot regions and statistically processing them.

Also, the characteristics of the plurality of detectors may be compared and the detector, for example, with good detection reproducibility, whose detection value has a small change with time, or whose detection value has a small change even when the mold and the substrate are changed may be defined as a good detector. The other detectors may be calibrated using the good detector as a reference. Further, calibration may be performed between the good detector and the external overlay measurement device, and the difference therebetween may be reflected on the other detectors. Offset values obtained by the calibration may be stored for a plurality of sets. For example, for each detector, the offset value may be stored for each combination of the mold and the substrate, for each image height of the mark pair to be detected, or for each coefficient of the correlation function with the detection result of the external overlay measurement device. The calibration operation may be performed, for example, for each process, for each lot, for each processing event, only in the first or last process, lot, or processing event, in both the first and last processes, lots, or processing events, or may be performed at given time intervals.

According to the embodiments described above, by calibrating individual differences among a plurality of detectors mounted in an imprint apparatus, it is possible to improve the detection accuracy of the relative position between the first mark and the second mark forming a mark pair. This can implement high overlay accuracy.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 6A:
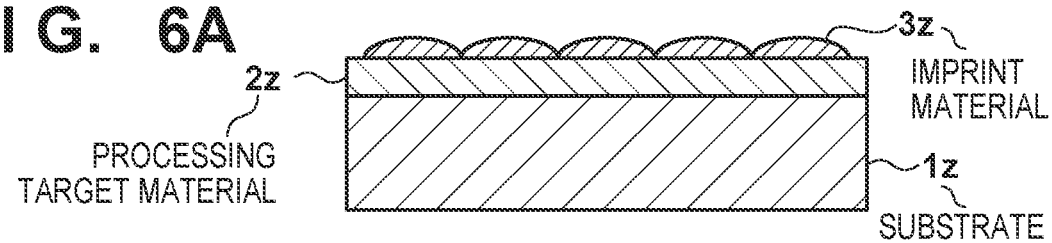
FIGS. 6A to 6F are views showing an article manufacturing method.

An article manufacturing method in which an imprint apparatus forms a pattern on a substrate, processes the substrate on which the pattern is formed, and manufactures an article from the processed substrate will be described next. As shown FIG. 6A, a substrate $1z$ such as a silicon wafer with a processed material $2z$ such as an insulator formed on the surface is prepared. Next, an imprint material $3z$ is applied to the surface of the processed material $2z$ by an inkjet method or the like. A state in which the imprint material $3z$ is applied as a plurality of droplets onto the substrate is shown here.

Figure 6B:
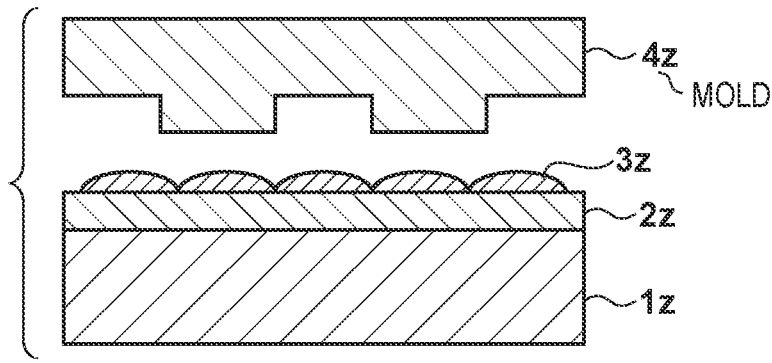
Figure 6C:
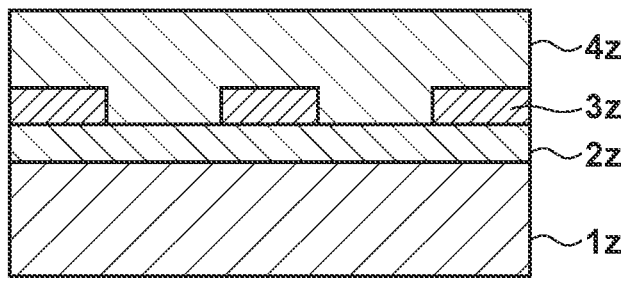

As shown in FIG. 6B, a side of a mold $4z$ for imprint with a concave-convex pattern is directed toward and made to face the imprint material $3z$ on the substrate. As shown FIG. 6C, the substrate $1z$ to which the imprint material $3z$ is applied is brought into contact with the mold $4z$, and a pressure is applied. The gap between the mold $4z$ and the processed material $2z$ is filled with the imprint material $3z$.

In this state, when the imprint material $3z$ is irradiated with light as energy for curing via the mold $4z$, the imprint material $3z$ is cured.

Figure 6D:
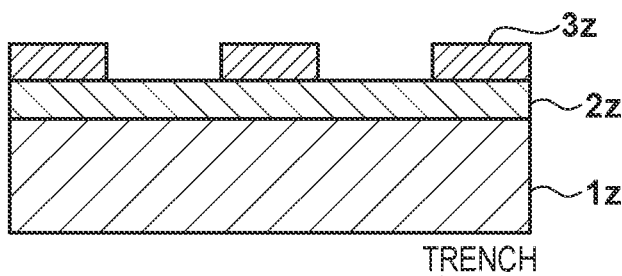

As shown in FIG. 6D, after the imprint material $3z$ is cured, the mold $4z$ is separated from the substrate $1z$, and the pattern of the cured product of the imprint material $3z$ is formed on the substrate $1z$. In the pattern of the cured product, the concave portion of the mold corresponds to the convex portion of the cured product, and the convex portion of the mold corresponds to the concave portion of the cured product. That is, the concave-convex pattern of the mold $4z$ is transferred to the imprint material $3z$.

Figure 6E:
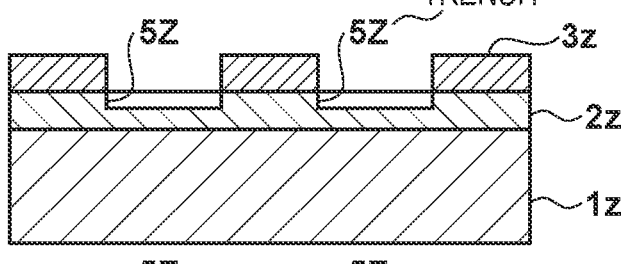
Figure 6F:
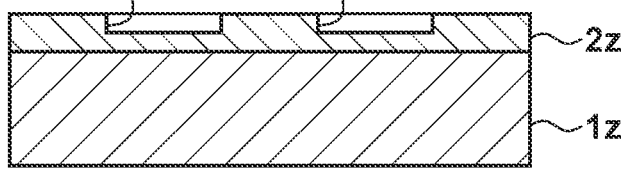

As shown in FIG. 6E, when etching is performed using the pattern of the cured product as an etching resistant mask, a portion of the surface of the processed material $2z$ where the cured product does not exist or remains thin is removed to form a groove $5z$. As shown in FIG. 6F, when the pattern of the cured product is removed, an article with the grooves $5z$ formed in the surface of the processed material $2z$ can be obtained. Here, the pattern of the cured product is removed. However, instead of removing the pattern of the cured product after the process, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-099733, filed May 28, 2019, which is hereby incorporated by reference herein in its entirety.

What is claimed is:

1. An imprint apparatus that brings an imprint material on a substrate including a first mark into contact with a mold including a second mark and cures the imprint material, thereby forming a cured product of the imprint material on the substrate, comprising:
    a plurality of detectors configured to detect a relative position between the first mark and the second mark; and
    a controller configured to:
        obtain a plurality of pieces of relative position information corresponding to the plurality of detectors by detecting the relative position between the first mark and the second mark a plurality of times using the plurality of detectors in a state in which the imprint material is cured and a positional relationship between the substrate and the mold is maintained; and
        calibrate, based on the plurality of pieces of relative position information, the plurality of detectors by using a piece of relative position information of a first detector of the plurality of detectors as a reference and correcting other pieces of relative position information of other detectors of the plurality of detectors by adding offset values to the other pieces of relative position information to match the reference.

2. The apparatus according to claim 1, wherein the controller is configured to obtain the plurality of pieces of relative position information using the plurality of detectors in a period after the imprint material is cured and before the cured product of the imprint material is separated from the mold.

3. The apparatus according to claim 1, wherein the controller is configured to detect the relative position the plurality of times after performing alignment between the substrate and the mold using at least one of the plurality of detectors and curing the imprint material.

4. The apparatus according to claim 3, wherein the controller is configured to detect the relative position between the first mark and the second mark using at least one of the plurality of detectors, and to perform the alignment based on a result of the detection.

5. The apparatus according to claim 3, wherein the controller is configured to detect, using at least one of the plurality of detectors, a relative position between a mark different from the first mark of the substrate and a mark different from the second mark of the mold, and to perform the alignment based on a result of the detection.

6. The apparatus according to claim 1, wherein the controller is configured to obtain the plurality of pieces of relative position information by executing processing of moving a detector selected from the plurality of detectors to a detection position of a mark pair formed by the first mark and the second mark and obtaining the relative position between the first mark and the second mark while changing the selected detector.

7. The apparatus according to claim 1, wherein the controller is configured to obtain the plurality of pieces of relative position information by executing processing of moving the substrate such that a mark pair formed by the first mark and the second mark enters a field of view of a detector selected from the plurality of detectors and obtaining the relative position between the first mark and the second mark while changing the selected detector.

8. The apparatus according to claim 1, wherein the controller is configured to calibrate the plurality of detectors in accordance with a preset condition.

9. An article manufacturing method comprising:
forming a pattern on a substrate using an imprint apparatus defined in claim 1; and
processing the substrate on which the pattern has been formed in the forming,
wherein an article is manufactured from the processed substrate.

* * * * *